United States Patent
Kunishi et al.

(10) Patent No.: US 9,530,797 B2
(45) Date of Patent: Dec. 27, 2016

(54) SEMICONDUCTOR SWITCH, WIRELESS APPARATUS, AND METHOD OF DESIGNING SEMICONDUCTOR SWITCH

(71) Applicant: KABUSHIKI KAISHA TOSHIBA, Tokyo (JP)

(72) Inventors: Yugo Kunishi, Yokohama Kanagawa (JP); Toshiki Seshita, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/634,866

(22) Filed: Mar. 1, 2015

(65) Prior Publication Data

US 2015/0348993 A1 Dec. 3, 2015

(30) Foreign Application Priority Data

May 29, 2014 (JP) .................................. 2014-111458

(51) Int. Cl.
*H04B 1/38* (2015.01)
*H01L 27/12* (2006.01)
*H03K 17/687* (2006.01)

(52) U.S. Cl.
CPC ......... *H01L 27/1203* (2013.01); *H03K 17/687* (2013.01)

(58) Field of Classification Search
CPC .......................... H01L 27/1203; H03K 17/687
USPC .................................................. 455/73, 575.7
See application file for complete search history.

(56) References Cited

U.S. PATENT DOCUMENTS

| | | | | | |
|---|---|---|---|---|---|
| 5,012,816 | A | * | 5/1991 | Lederer | A61H 39/002 128/907 |
| 5,936,280 | A | * | 8/1999 | Liu | H01L 21/84 257/347 |
| 6,294,829 | B1 | * | 9/2001 | Liu | H01L 21/84 257/723 |
| 6,836,172 | B2 | * | 12/2004 | Okashita | H01L 21/761 257/E21.544 |
| 2003/0222704 | A1 | * | 12/2003 | Okashita | H01L 21/761 327/427 |
| 2008/0064358 | A1 | * | 3/2008 | Sagae | H01L 21/84 455/333 |
| 2011/0001543 | A1 | * | 1/2011 | Kondo | H01L 27/0207 327/419 |
| 2011/0221519 | A1 | * | 9/2011 | Katoh | H04B 1/0057 327/558 |
| 2013/0002338 | A1 | * | 1/2013 | Kondo | H01L 27/0207 327/419 |

(Continued)

FOREIGN PATENT DOCUMENTS

JP 2012-070181 A 4/2012

*Primary Examiner* — April G Gonzales
(74) *Attorney, Agent, or Firm* — Patterson & Sheridan, LLP

(57) ABSTRACT

A semiconductor switch on a SOI substrate that includes a supporting substrate, an insulating layer on the supporting substrate, and a semiconductor layer provided on the insulating layer, includes a first and a second through FET groups, each including a plurality of field effect transistors connected in series between a common node and a first and second node, respectively. The first through FET group has an area equal to or less than an area Sfet, which is calculated by using an equivalent circuit including a resistance that represents leakage of a high frequency signal from the first through FET group to the supporting substrate.

16 Claims, 14 Drawing Sheets

(56) References Cited

U.S. PATENT DOCUMENTS

| | | | |
|---|---|---|---|
| 2013/0083703 A1* | 4/2013 | Granger-Jones | H04B 1/525 370/277 |
| 2013/0127495 A1* | 5/2013 | Miyazaki | H03K 17/567 326/41 |
| 2014/0197461 A1* | 7/2014 | Briere | H01L 29/0649 257/194 |

* cited by examiner

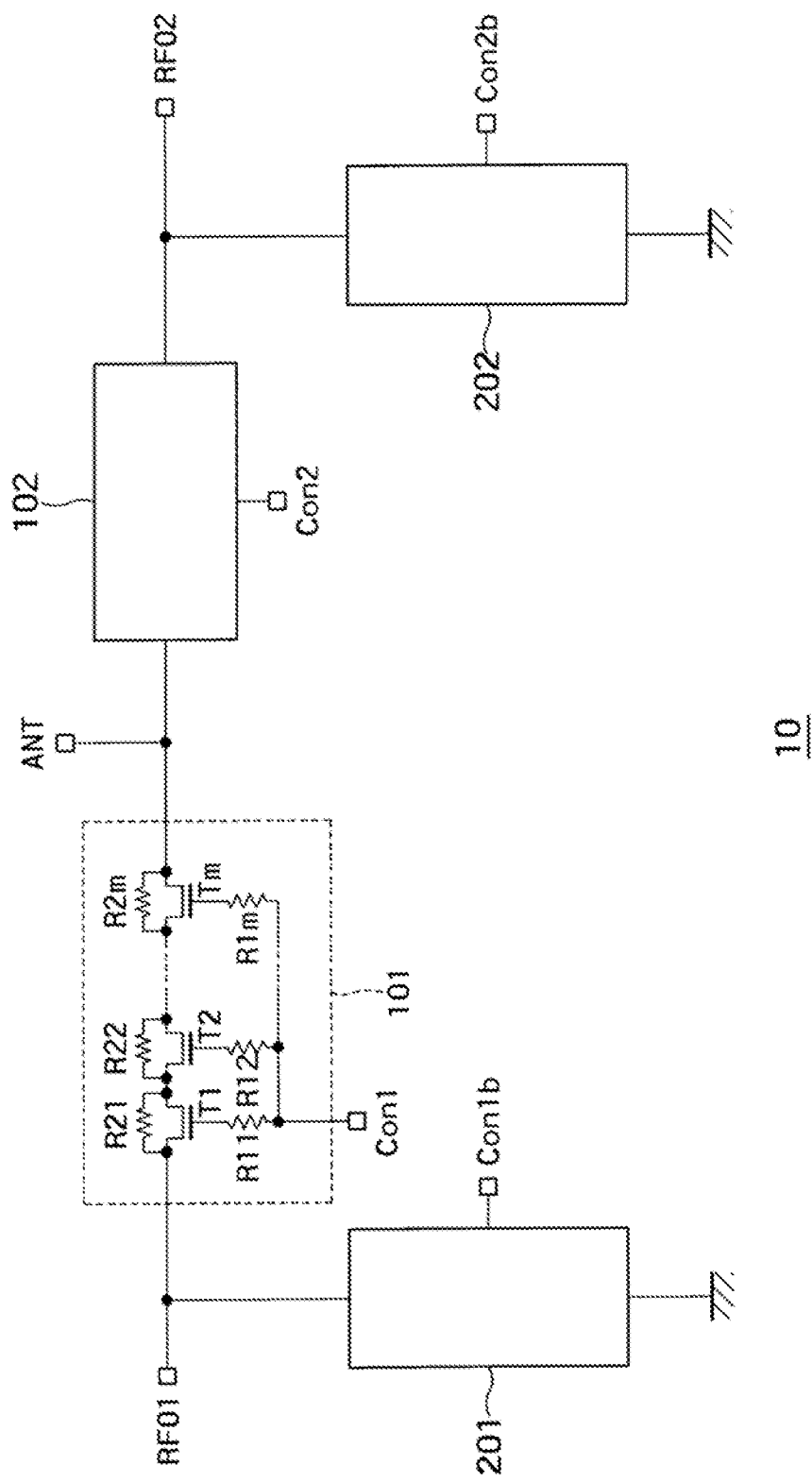

SEMICONDUCTOR SWITCH, WIRELESS APPARATUS, AND METHOD OF DESIGNING SEMICONDUCTOR SWITCH

CROSS-REFERENCE TO RELATED APPLICATION

This application is based upon and claims the benefit of priority from Japanese Patent Application No. 2014-111458, filed May 29, 2014, the entire contents of which are incorporated herein by reference.

FIELD

Embodiments described herein relate generally to a semiconductor switch, a wireless apparatus, and a method of designing a semiconductor switch.

BACKGROUND

In a wireless apparatus, such as a mobile phone and the like, a transmitting circuit and a receiving circuit are connected to a common antenna through a high-frequency semiconductor switch (hereinafter, referred to as a semiconductor switch) which switches the connection to the common antenna between the transmitting and receiving circuits. The semiconductor switch includes a Metal-oxide-semiconductor field-effect transistor (MOSFET) formed on a Silicon on Insulator (SOI) substrate. In such a semiconductor switch, it is desirable to reduce insertion loss in a high frequency region.

DESCRIPTION OF THE DRAWINGS

FIG. 1 is a diagram illustrating a schematic configuration of a semiconductor switch according to a first embodiment.

DETAILED DESCRIPTION

Figure 2A:
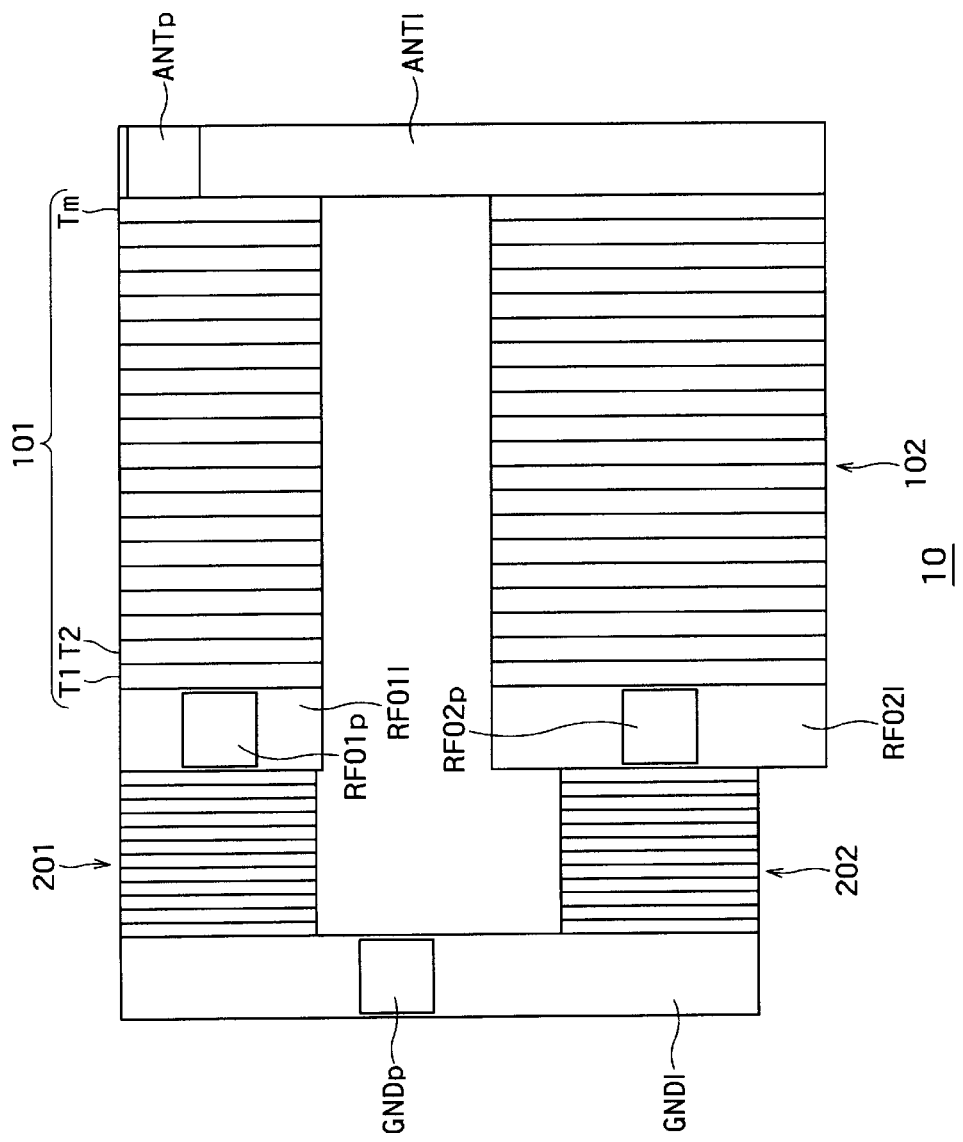
FIG. 2A is a diagram illustrating a schematic layout of the semiconductor switch of FIG. 1.

The present disclosure describes an example of a semiconductor switch having reduced insertion loss in a high frequency region, a wireless apparatus, and a method of designing a semiconductor switch.

In general, according to an embodiment, a semiconductor switch is provided on a SOI substrate. The SOI substrate includes a supporting substrate, an insulating layer on the supporting substrate, and a semiconductor layer on the insulating layer. The semiconductor switch includes a first to an $n^{th}$ (where n is an integer of two or more) through FET groups. For example, when n=2 the semiconductor switch includes first and second through FET groups. Each through FET group includes a plurality of field effect transistors connected in series between a common node and respective node, such as, for example, that the first through FET group is connected to a first node, the second through FET group is connected to a second node, and an $i^{th}$ through FET group is connected to an $i^{th}$ node. An area of the first through FET group is equal to or less than an area Sfet, which is calculated by using an equivalent circuit including a resistance Rs that represents leakage of a high frequency signal from the first through FET group to the supporting substrate.

Hereinafter, example embodiments of the present disclosure will be described referring to drawings. The present disclosure is not limited to these example embodiments.

First Embodiment

One feature of a first embodiment is that an area of MOSFET included in a semiconductor switch 10 is limited.

FIG. 1 is a diagram illustrating a schematic configuration of the semiconductor switch (antenna switch) 10 according to the first embodiment. FIG. 1 illustrates an example in which a semiconductor switch is a Single-Pole Double-Throw (SPDT) switch. The semiconductor switch 10 includes a through FET group (first through FET group) 101, a through FET group (second through FET group) 102, a shunt FET group 201, and a shunt FET group 202. The semiconductor switch 10 is provided on a SOI substrate which has a supporting substrate, an insulating layer (Buried Oxide (BOX) layer) provided on the supporting substrate, and a semiconductor layer provided on the insulating layer.

The through FET group 101 is connected between an antenna terminal (common node) ANT through which a high frequency signal with a frequency of, for example, 3.5 GHz or more is input or output and a high frequency terminal (first node) RF01 through which a high frequency signal is input or output. The through FET group 101 switches between a conductive state and a non-conductive state and thus selectively connects or disconnects the antenna terminal ANT and the high frequency terminal RF01 in response to a switch control signal Con1.

The through FET group 102 is connected between the antenna terminal ANT and a high frequency terminal (second node) RF02 through which a high frequency signal is input or output. The through FET group 102 switches between a conductive state and a non-conductive state and thus selectively connects or disconnects the antenna terminal ANT and the high frequency terminal RF02 in response to a switch control signal Con2.

"Node" in this disclosure is a concept which includes not only a physical signal connection point such as a port, a terminal, or the like, but also any point on patterns or signal wirings of the same potential.

The shunt FET group 201 is connected between the high frequency terminal RF01 and a ground, and switches between a conductive state and a non-conductive state to connect/disconnect the high frequency terminal RF01 and the ground in response to a switch control signal Con1b.

The shunt FET group 202 is connected between the high frequency terminal RF02 and a ground, and switches between a conductive state and a non-conductive state to connect/disconnect the high frequency terminal RF02 and the ground in response to a switch control signal Con2b.

The through FET group 101 includes) MOSFETs (first field effect transistors) T1 to T$m$, where m is an integer of two or more. MOSFETs T1 to T$m$ are connected in series between the antenna terminal ANT and the high frequency terminal RF01. In the semiconductor switch 10, m may be seven or more according to a communication method such as a Global System for Mobile communication (GSM, registered trademark) method and the like. In the semiconductor switch 10 according to a 3G/4G communication method such as a Universal Mobile Telecommunications System (UMTS), a Long Term Evolution (LTE), and the like, m may be three or more.

The switch control signal Con1 is input to a gate of the MOSFETs T1 to T$m$ through resistances R11 to R1$m$. Leakage from channel to gate is reduced by connecting the resistances R11 to R1$m$, thereby suppressing attenuation of a high-frequency signal.

By the switch control signal Con1, a state of the MOSFETs T1 to T$m$ is controlled to be a conductive state or a non-conductive state. In a SPDT switch, only one of through FET groups 101 and 102 is in a conductive state at a time, and the other group is in a non-conductive state. In addition, for example, when the through FET group 101 is controlled to be in a conductive state, the shunt FET group 202 is also controlled to be in a conductive state, and the shunt FET group 201 is controlled to be in a non-conductive state.

Resistances R21 to R2$m$ for equalizing a potential difference between a source and a drain of each MOSFET T1 to T$m$ when in a non-conductive state are connected between the source and the drain of each MOSFET T1 to T$m$.

Since the through FET group 102 and the shunt FET groups 201 and 202 also have a circuit configuration the same as above described for through FET group 101, specific illustration and description of the circuit configuration for FET group 102 and the shunt FET groups 201 and 202 are omitted.

FIG. 2A is a diagram illustrating a schematic layout of the semiconductor switch 10 of FIG. 1. As illustrated in FIG. 2A, one terminal of the through FET group 101 is connected to an antenna pad ANTp through an antenna wiring ANT1, and the other terminal is connected to a high frequency pad RF01p through a high frequency signal wiring RF011. The antenna pad ANTp electrically corresponds to the antenna terminal ANT, and the high frequency pad RF01p electrically corresponds to the high frequency terminal RF01.

One terminal of the through FET group 102 is connected to the antenna pad ANTp through the antenna wiring ANT1, and the other terminal is connected to a high frequency pad RF02p through a high frequency signal wiring RF021. The high frequency pad RF02p electrically corresponds to the high frequency terminal RF02.

The high frequency signal wiring RF011 is connected to a ground wiring GND1 through the shunt FET group 201. The high frequency signal wiring RF021 is connected to the ground wiring GND1 through the shunt FET group 202. The ground wiring GND1 is connected to a ground pad GNDp, and the ground pad GNDp is grounded outside the semiconductor switch 10.

In FIG. 2A, the resistances R11 to R1$m$, R21 to R2$m$ are not specifically illustrated for clearer description.

Incidentally, it is difficult to estimate an actual insertion loss in a high frequency region of the semiconductor switch 10. The present inventors have noticed independently that the insertion loss in the high frequency region relates to leakage to the supporting substrate on the SOI substrate, and it is necessary to consider this leakage to reduce the insertion loss. Since a portion of a high frequency signal leaks from drain, source, and body regions of the through FET group 101 to a supporting substrate through a BOX (buried oxide) layer in the semiconductor switch 10, it is necessary to reduce leakage to reduce insertion loss.

From the reason described above, leakage amount is proportional to an area of the through FET group 101. Accordingly, it is preferable to have a small area. For example, in order to realize a desired insertion loss (for example, 1 dB), an area of the through FET group 101 may satisfy a following expression 1.

$$Sfet \le (1.08 - 0.11 \times Ron - 1.1 \times Ctotal^2 - 160/\rho s)/(2 + 4.5 \times 10^4/\rho s) \quad \text{(Expression 1)}$$

Here, Sfet is an area of the through FET group. Ron is a resistance value of the through FET group 101 when the through FET group 101 is in a conductive state. Ctotal is a sum of off capacitances Coff of the through FET group 102 when in a non-conductive state. $\rho s$ is resistivity of the supporting substrate. A unit of Sfet is set to be $cm^2$, a unit of Ron is set to be $\Omega$, a unit of Ctotal is set to be pF, and a unit of $\rho s$ is set to be $\Omega cm$.

That is, in the first embodiment, a maximum area of the through FET group 101 is determined according to a desired insertion loss and a circuit configuration (that is, Ron, Ctotal, and $\rho s$). Accordingly, leakage of a high frequency signal from the through FET group 101 to the supporting substrate is reduced, and it is possible to reduce insertion loss in the high frequency region (as an example, 3.5 GHz) to a desired value (as an example, 1 dB) or less. The insertion loss is a difference between power of a high frequency signal input to the high frequency terminal RF01 (or the antenna terminal ANT) and power of a high frequency signal output from the antenna terminal ANT (or the high frequency terminal RF01).

The relevant area of the through FET group 101 will be defined according to the below examples.

Figure 2B:
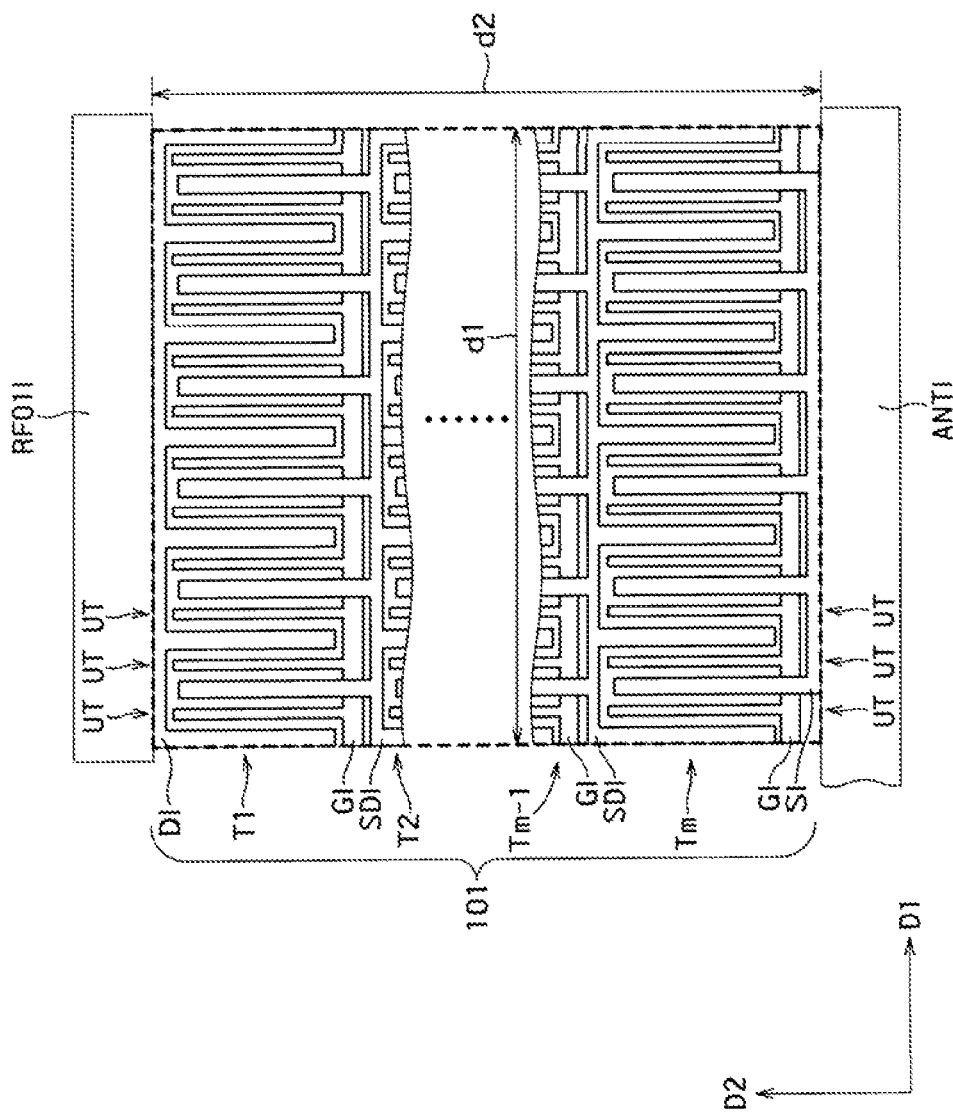
FIG. 2B is an enlarged diagram of a through FET group of FIG. 2A.

FIG. 2B is an enlarged diagram of the through FET group 101 depicted in FIG. 2A. FIG. 2B illustrates the MOSFETs T1 and T$m$, and a portion of the MOSFETs T2 and T$m-1$, and other MOSFETs are not specifically illustrated. Each of the MOSFETs T1 to T$m$ is configured to include a plurality of unit MOSFETs UT aligned in a first direction D1. Gate, source, and drain of each unit MOSFET UT extend in a second direction D2 substantially orthogonal to the first direction D1. In each of the MOSFET T1 to T$m$, gates of the plurality of unit MOSFETs UT are connected to each other by a gate wiring G1. M MOSFETs T1 to T$m$ are aligned along the second direction D2.

Drains of the plurality of unit MOSFETs UT of the MOSFET T1 are connected to each other by a drain wiring D1, and the drain wiring D1 is connected to the high frequency signal wiring RF011 extending in the first direction D1. Sources of the plurality of unit MOSFETs UT of the MOSFET T1 are connected to each other and drains of the plurality of unit MOSFETs UT of the MOSFET T2 are connected to each other by a wiring SD1.

Sources of the plurality of unit MOSFETs UT of the MOSFET Tm are connected to each other by a source wiring S1, and the source wiring S1 is connected to the antenna wiring ANT1 extending in the first direction D1.

In the first embodiment, an area of the through FET group 101 is the area of a region surrounded by a dashed line in FIG. 2B. That is, the area is a product of a length d1 of the wiring SD1 along the first direction D1 and a distance d2 along the second direction D2 that is between the high frequency signal wiring RF011 and the antenna wiring ANT1.

However, definition of the area is not limited to the specific example calculation, and other calculated areas that are proportional to specific example area may be adopted if the same effect is obtained, and the definition of the area may be considered to be enlarged to include such other calculation methods.

The shunt FET groups 201 and 202 do not need to be provided in some embodiments. In addition, areas of the through FET group 101 and the through FET group 102 are depicted as different from each other in FIG. 2A; however, the respective areas may be the same as each other.

Moreover, the semiconductor switch 10 may be configured as a Single-Pole n-Throw (SPnT) switch of one input n (n is an integer of two or more) output. In this case, the semiconductor switch 10 includes a first to an $n^{th}$ through FET groups. An $i^{th}$ (i is an integer of two to n) through FET group includes a plurality of $i^{th}$ field effect transistors connected in series between a high frequency terminal (an $i^{th}$ node) and the antenna terminal ANT, and switches a conductive state or a non-conductive state between the high frequency terminal (the $i^{th}$ node) and the antenna terminal. Each area of the first to the $n^{th}$ through FET groups may be different from each other; however, it is preferable that the areas of the FET groups be equal to each other because it is possible to equalize features of a plurality of high frequency terminals with each other.

Next, a process for deriving Expression 1 will be described.

Figure 3:
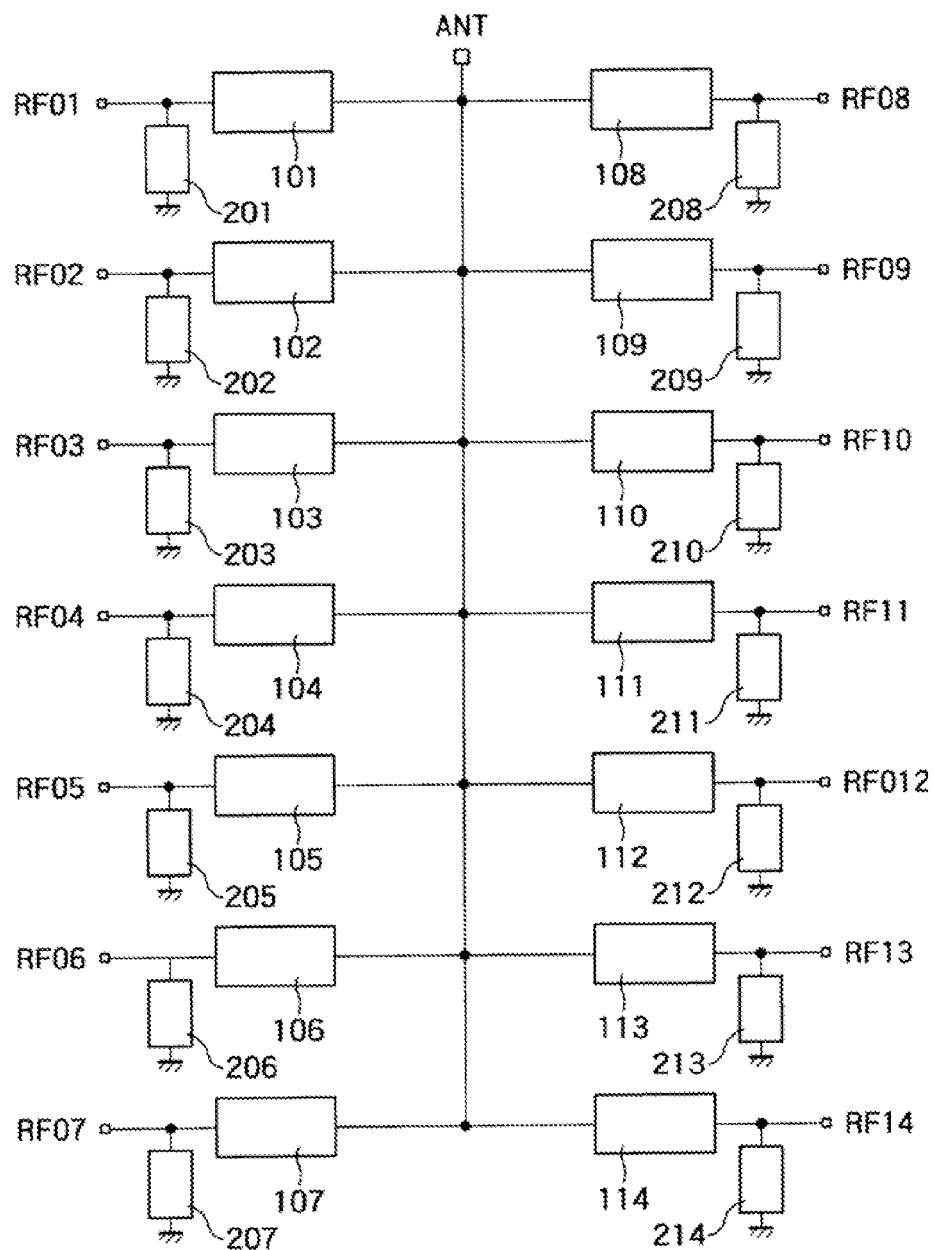
FIG. 3 is a block diagram illustrating a schematic configuration of an SP14T switch.

FIG. 3 is a block diagram illustrating a schematic configuration of a Single-Pole 14-Throw (SP14T) switch. In the same manner as FIG. 1, one terminal of each of through FET groups 101 to 114 is connected to the antenna terminal ANT in a common manner, and the other terminal of each of the through FET groups 101 to 114 is connected to a corresponding high frequency terminal among high frequency terminals RF01 to RF14 (an $i^{th}$ node). In such a SPnT switch, only one through FET group is controlled to be in a conductive state among the n through FET groups, and the other n through FET groups are controlled to be in a non-conductive state.

Figure 4:
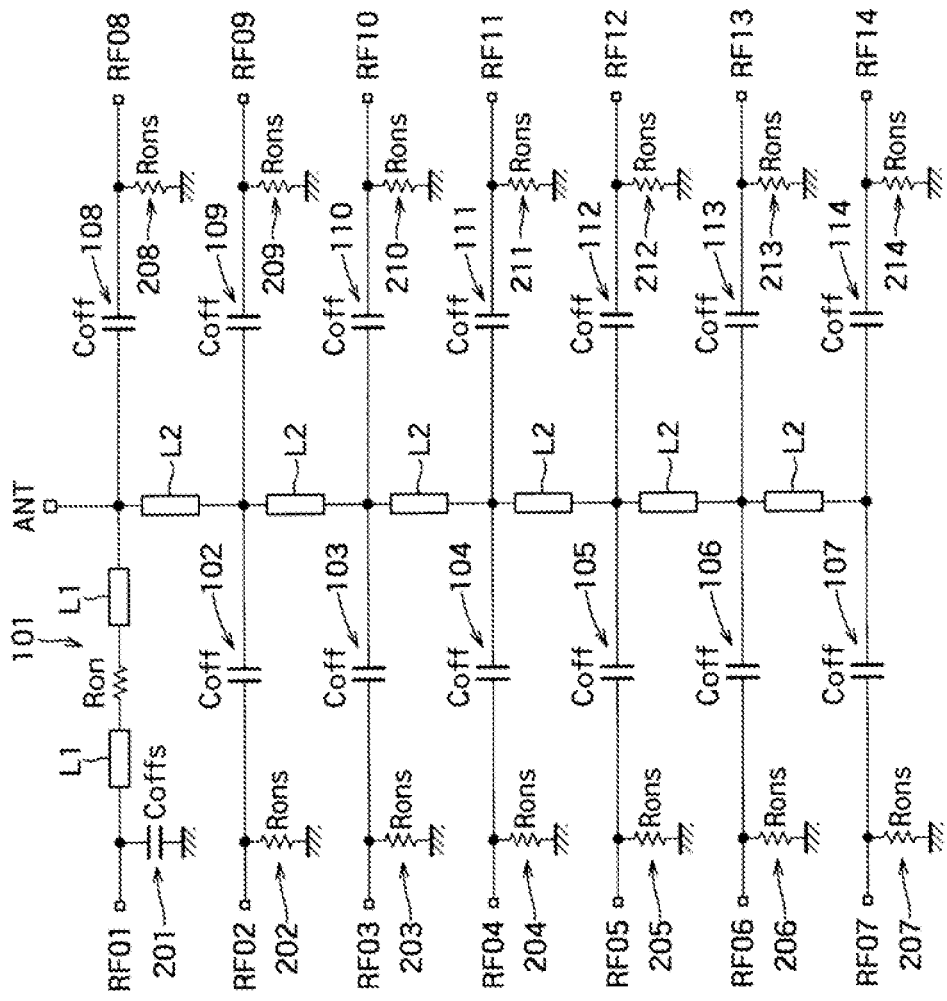
FIG. 4 is an electric equivalent circuit diagram when an interval between an antenna terminal and a high frequency terminal of the SP14T switch of FIG. 3 is in a conductive state.

FIG. 4 is an electric equivalent circuit diagram when an interval between the antenna terminal ANT and the high frequency terminal RF01 of the SP14T switch of FIG. 3 is in a conductive state. In FIG. 4, the through FET group 101, which is in a conductive state, is represented by on-state resistance Ron, and the through FET groups 102 to 114, which are in a non-conductive state, are represented by off-capacitance Coff. In addition, shunt FET groups 202 to 214, which are in a conductive state, are represented by on-state resistance Rons, and the shunt FET group 201, which is in a non-conductive state, is represented by off-capacitance Coffs.

In the through FET group 101, which is in a conductive state, in order to consider areas of the MOSFETs T1 to Tm as a signal line, a micro strip line L1 of a line length which is a half of the length of the MOSFET is connected to both ends of the on-state resistance Ron, respectively. A micro strip line L2 is connected between the antenna terminal ANT and each through FET group. The micro strip line L2 corresponds to the antenna wiring ANT1 of FIG. 2A.

For example, a width of the micro strip line L1 is 150 µm, a length thereof is 100 µm, and a thickness thereof is 1 µm. In addition, for example, a width of the micro strip line L2 is 50 µm, a length thereof is 150 µm, and a thickness thereof is 1 µm. A relative dielectric constant ∈r of a dielectric substance of the micro strip lines L1 and L2 is 11.9 and a height h is 200 µm.

Figure 5:
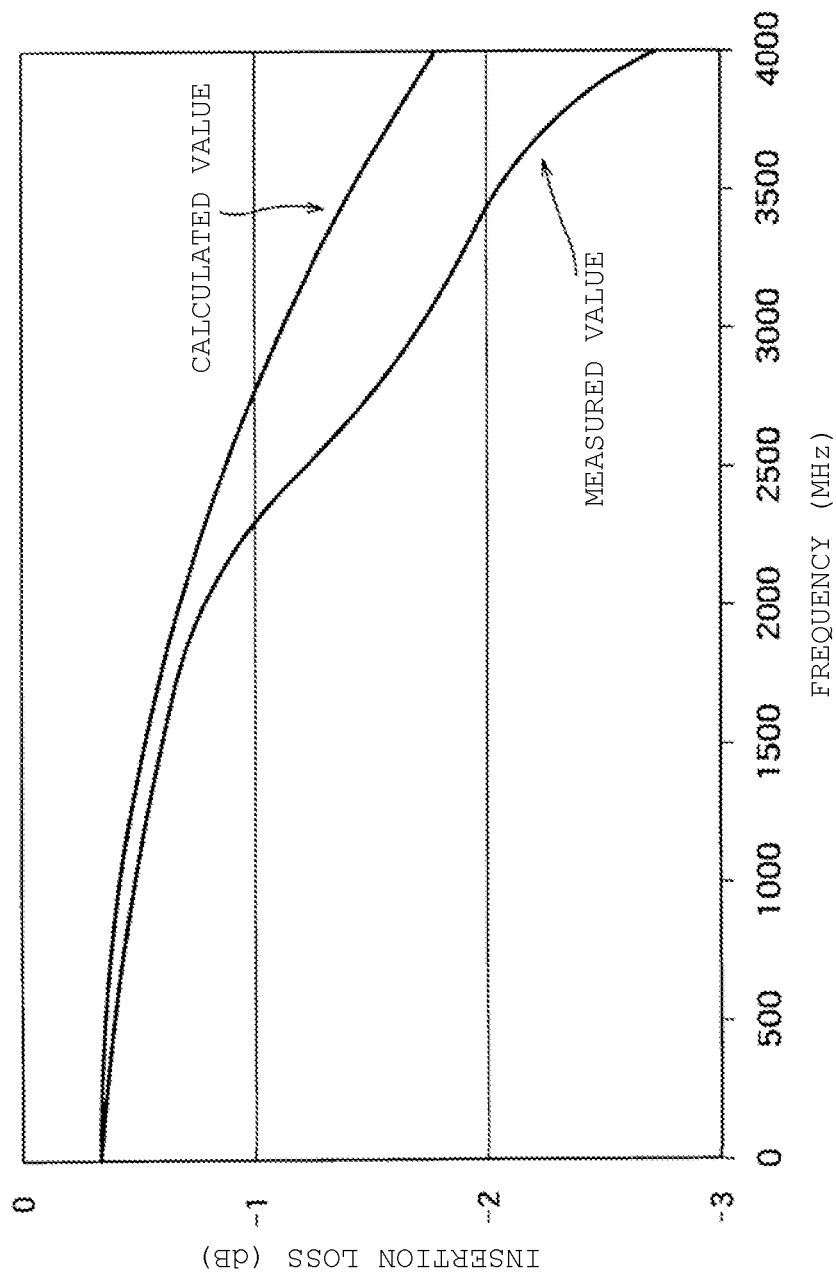
FIG. 5 is a diagram illustrating frequency dependence of insertion loss measured in an experiment using the SP14T switch of FIG. 3 and insertion loss calculated from the equivalent circuit of FIG. 4.

FIG. 5 is a diagram illustrating frequency dependence of insertion loss measured in an experiment using the SP14T switch of FIG. 3 and insertion loss calculated from the equivalent circuit of FIG. 4. A gate width Wg of the MOSFET of the SP14T switch is 3.0 mm, and the number m of stages of series connection of MOSFET (the number of stacks) is 12. As illustrated in FIG. 5, while a difference between a measured value and a calculated value is about 0.1 dB or less at a frequency of 1 GHz or less, a large difference of about 0.6 dB occurs at a frequency of 3.5 GHz (3500 megahertz).

In addition, a measured insertion loss decreases with an increase of frequency, and the decrease amount is increases at frequencies particularly above 3 GHz.

Accordingly, as described above, leakage to a supporting substrate on the SOI substrate is considered so as to accurately estimate insertion loss. In this example, the leakage of a high frequency signal is represented by an equivalent circuit in which a resistance Rs is connected between the on-state resistance Ron and the ground. That is, the resistance Rs represents leakage of a high frequency signal from the through FET group 101 to the supporting substrate. Specifically, one end of the resistance Rs is connected to a connection node between the on-state resistance Ron and the micro strip line L1 on the high frequency terminal RF01 side.

As described above, since leakage is proportional to an area of the through FET group, there is a relationship of Rs∝1/Sfet. In addition, when the resistivity ρs of the supporting substrate is small, a high frequency current leaking to the supporting substrate is increased. In order to suppress this, it is preferable that a high resistance substrate whose resistivity ρs is 1 kΩcm or more be used on/with the supporting substrate.

Figure 6:
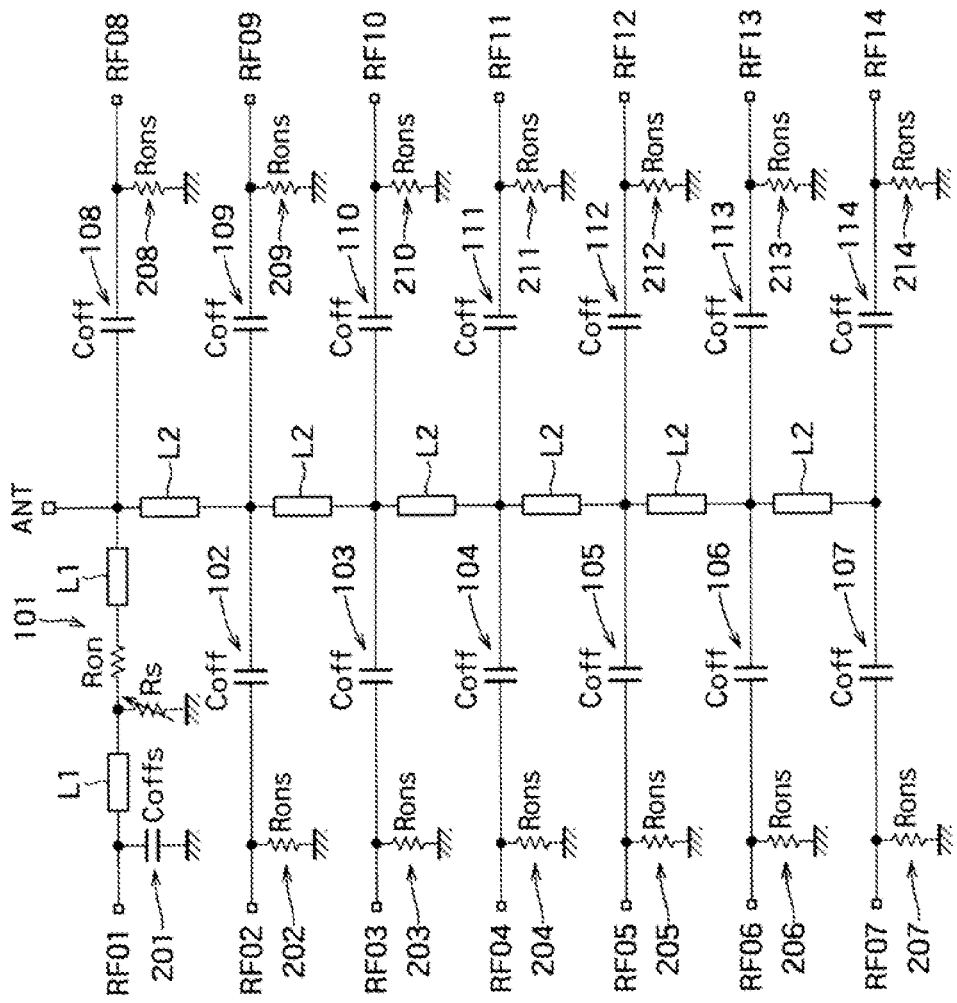
FIG. 6 is an equivalent circuit of the SP14T switch in which a resistance is considered.
Figure 7:
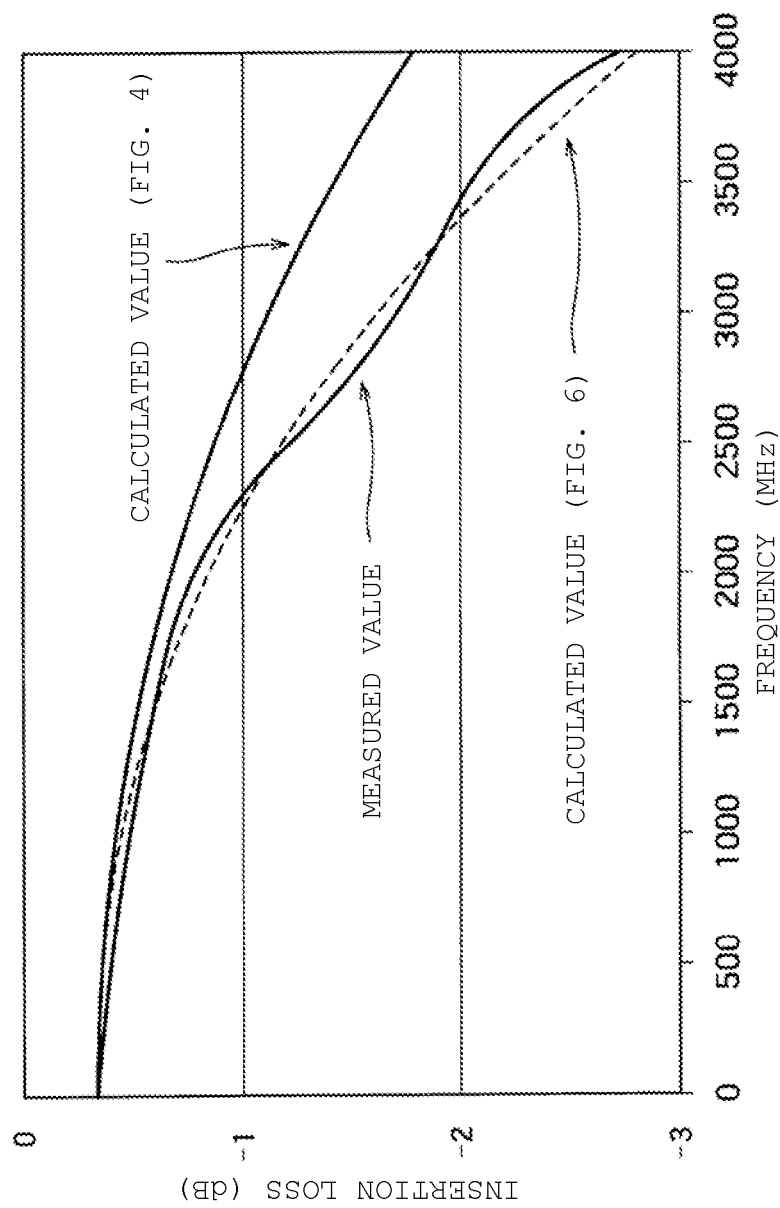
FIG. 7 is a graph illustrating frequency dependence of insertion loss of the SP14T switch calculated in the equivalent circuit of FIG. 6.

FIG. 6 is an equivalent circuit diagram of the SP14T switch in which the resistance Rs is considered. By using this equivalent circuit, insertion loss is again calculated with the resistivity ρs set to be 2 kΩcm and the other parameters having the same conditions as in FIG. 4. As a result, when $Rs=\rho s/Sfet \times 0.15 \times 1/(f0/10^9)^3$ is set to be Expression 2, as illustrated in FIG. 7, it is possible to reproduce a measured result with good accuracy. In Expression 2, f0 represents a frequency of a high frequency signal. That is, the resistance Rs is a function of the area Sfet, the resistivity ρs, and the frequency f0 of a high frequency signal.

FIG. 7 is a graph illustrating frequency dependence of insertion loss of the SP14T switch calculated in the equivalent circuit of FIG. 6. As illustrated in FIG. 7, by adding the resistance Rs, a difference between a calculated value and a measured value of insertion loss at a frequency of 3.5 GHz is reduced to about 0.1 dB. Moreover, in FIG. 7, a graph of the calculated values (FIG. 4) is increasingly separated from that of the measured values beyond 2 GHz; however, a graph of the calculated values (based on the equivalent circuit in FIG. 6) is close to that of the measured values even at a frequency of 2 GHz or more.

Then, by using an equivalent circuit based on the SPDT switch for the sake of simplicity, each of the on-state resistance Ron, the sum Ctotal of the off-capacitance Coff, the area Sfet, and the resistivity ρs of the supporting substrate is set as a variation parameter, and a relationship between an insertion loss IL at 3.5 GHz and a parameter is sought.

Figure 8:
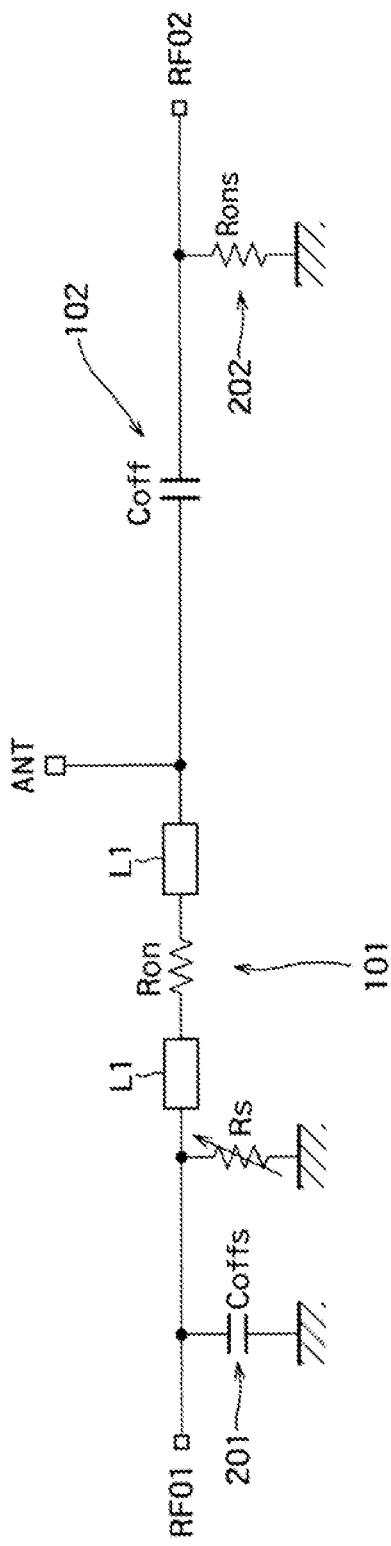
FIG. 8 is an equivalent diagram of an SPDT switch in which the resistance is considered.

FIG. 8 is an equivalent diagram of the SPDT switch in which the resistance Rs is considered. By using this equivalent circuit, the on-state resistance Ron is set to be 4Ω, the sum Ctotal of the off-capacitance Coff is set to be 0.7 pF, the area Sfet is set to be 0.03 cm$^2$, the resistivity ρs of the supporting substrate is set to be 2 kΩcm, and each of the parameters is individually varied, whereby the insertion loss IL at 3.5 GHz is calculated. As ranges for each parameter variation, the on-state resistance Ron is set to be 1Ω to 6Ω, the sum Ctotal of the off-capacitance Coff is set to be 0.1 to 1.0 pF, the area Sfet is set to be 0.001 to 0.05 cm$^2$, and the resistivity ρs of the supporting substrate is set to be 1 kΩcm to 5 kΩcm. Since the through FET group in a non-conductive state is one in this circuit, Ctotal=Coff.

Figure 9:
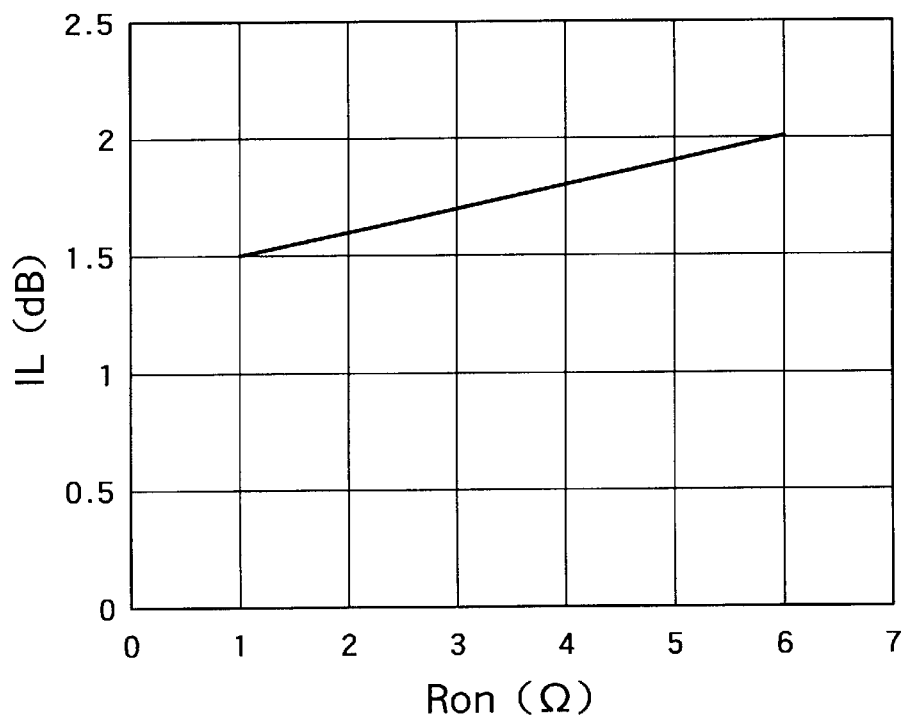
FIG. 9 is a graph illustrating a relationship between insertion loss and on-state resistance.
Figure 10:
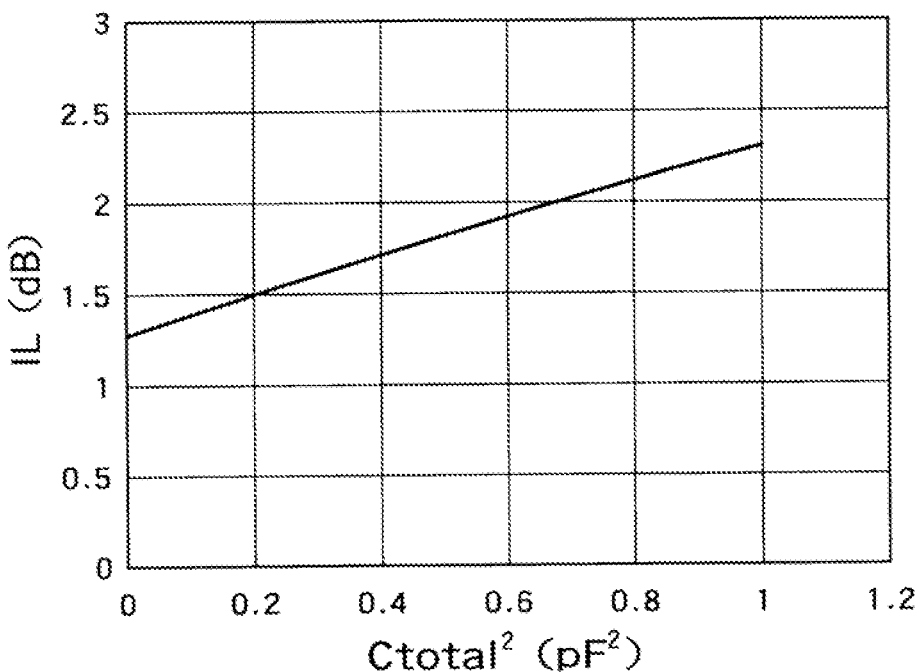
FIG. 10 is a graph illustrating a relationship between the insertion loss and the square of a sum of off capacitance.
Figure 11:
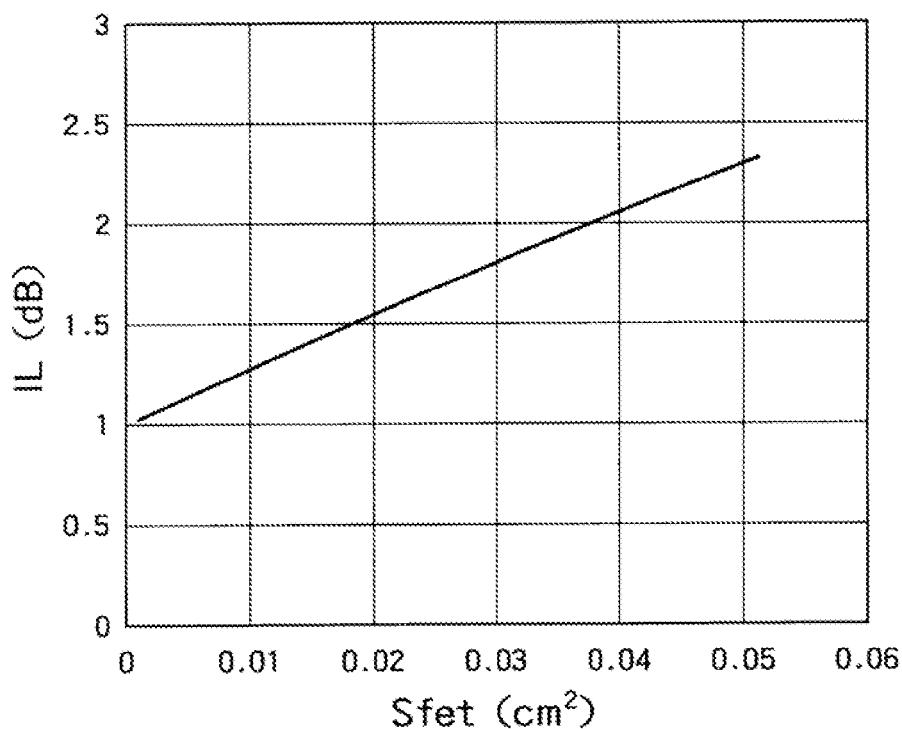
FIG. 11 is a graph illustrating a relationship between the insertion loss and an area.
Figure 12:
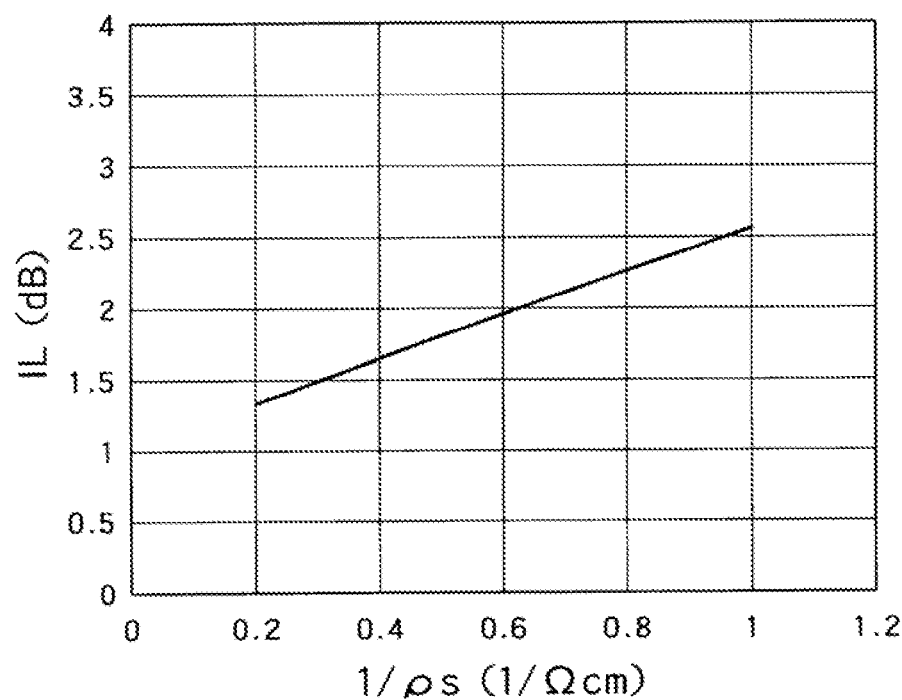
FIG. 12 is a graph illustrating a relationship between the insertion loss and $1/\rho s$.

The calculation results are illustrated in FIGS. 9 to 12. FIG. 9 is a graph illustrating a relationship between the insertion loss IL and the on-state resistance Ron, and FIG. 10 is a graph illustrating a relationship between the insertion loss IL and the square of the sum Ctotal of the off capacitance Coff. FIG. 11 is a graph illustrating a relationship between the insertion loss IL and the area Sfet, and FIG. 12 is a graph illustrating a relationship between the insertion loss IL and 1/ρs. From these calculation results, it is known that the insertion loss IL is proportional to the on-state resistance Ron, the square of the sum Ctotal of the off capacitance Coff, and the area Sfet, and is inversely proportional to the resistivity ρs.

Then, a multi-way layout analysis by a complete multi-way layout (16 sets) of four factors is performed using an experimental design method, and an equation satisfying each relationship of FIGS. 9 to 12 is sought. As a result, a next Expression 3 is obtained.

$$IL=0.11 \times Ron + 1.1 \times C^2 + 2 \times Sfet + 160/\rho s + 4.5 \times 10^4 \times Sfet/\rho s - 0.08 \quad \text{(Expression 3)}$$

From this Expression 3, the area Sfet satisfying that the insertion loss IL is 1 dB or less is calculated by, as described above Expression 1, $$Sfet \leq (1.08 - 0.11 \times Ron - 1.1 \times C^2 - 160/\rho s)/(2 + 4.5 \times 10^4/\rho s) \quad \text{(Expression 1)}.$$

That is, an area of the through FET group 101 less than or equal to the area Sfet calculated using an equivalent circuit including the resistance Rs or less. The area Sfet is a function of the insertion loss IL, the on-state resistance Ron of the through FET group 101 in a conductive state, the sum Ctotal of the off-capacitance Coff of a second to an n$^{th}$ through FET groups in a non-conductive state, and the resistivity ρs.

Then, for example, in a SPDT switch in which resistivity ρs of a supporting substrate is 2 kΩcm, on-state resistance Ron is 3Ω, a sum Ctotal of off-capacitance Coff is 0.05 pF, an area may be set to be 0.027 cm$^2$ or less based on Expression 1. Accordingly, the insertion loss IL at 3.5 GHz may be set to be about 1 dB or less.

Figure 13:
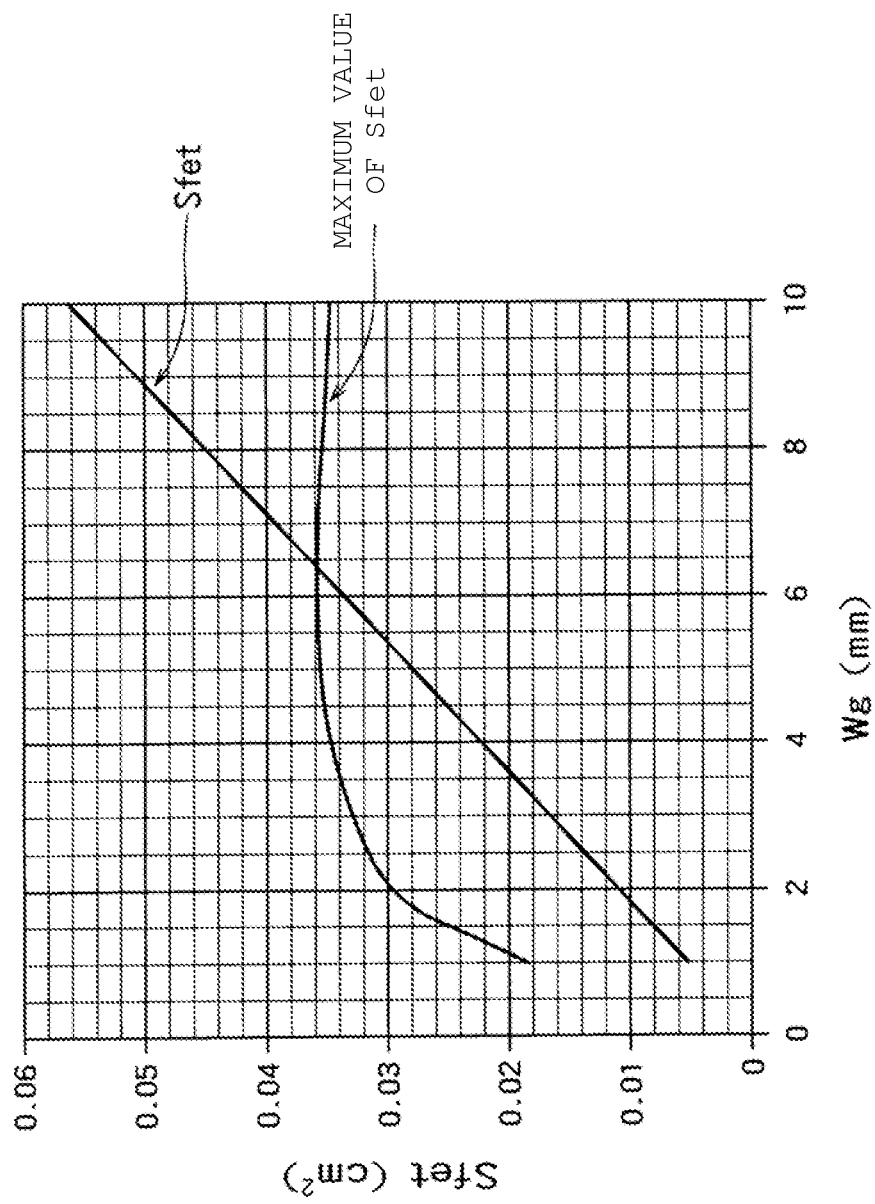
FIG. 13 is a graph illustrating a relationship between a gate width Wg and the area of the through FET group in the SPDT switch, and a relationship between the gate width Wg and a maximum value of the area in which insertion loss of 3.5 GHz becomes 1 dB or less.

FIG. 13 is a graph illustrating a relationship between the gate width Wg and the area Sfet of the through FET group 101 in the SPDT switch, and a relationship between the gate width Wg and a maximum value of the area Sfet in which insertion loss of 3.5 GHz becomes 1 dB or less. Here, the number m of stacks is set to be seven by using a process in which a RonCoff product is 0.15 pFΩ.

As illustrated in FIG. 13, when the gate width Wg is larger than 6.3 mm, the area Sfet exceeds a maximum value. Therefore, the gate width Wg in the SPDT switch may be 6.3 mm or less.

Here, when the gate width Wg of the MOSFET becomes too small, on-state resistance of the MOSFET is increased, whereby insertion loss is increased. In order to set the insertion loss IL to be 1 dB or less, the on-state resistance Ron has to be set to be 12Ω or less. Therefore, for example, in a case of MOSFET in which on-state resistance near a gate width Wg of 1 mm is 0.7Ω, the gate width Wg is necessarily set to be 0.4 mm or more when the number m of stacks is seven.

Figure 14:
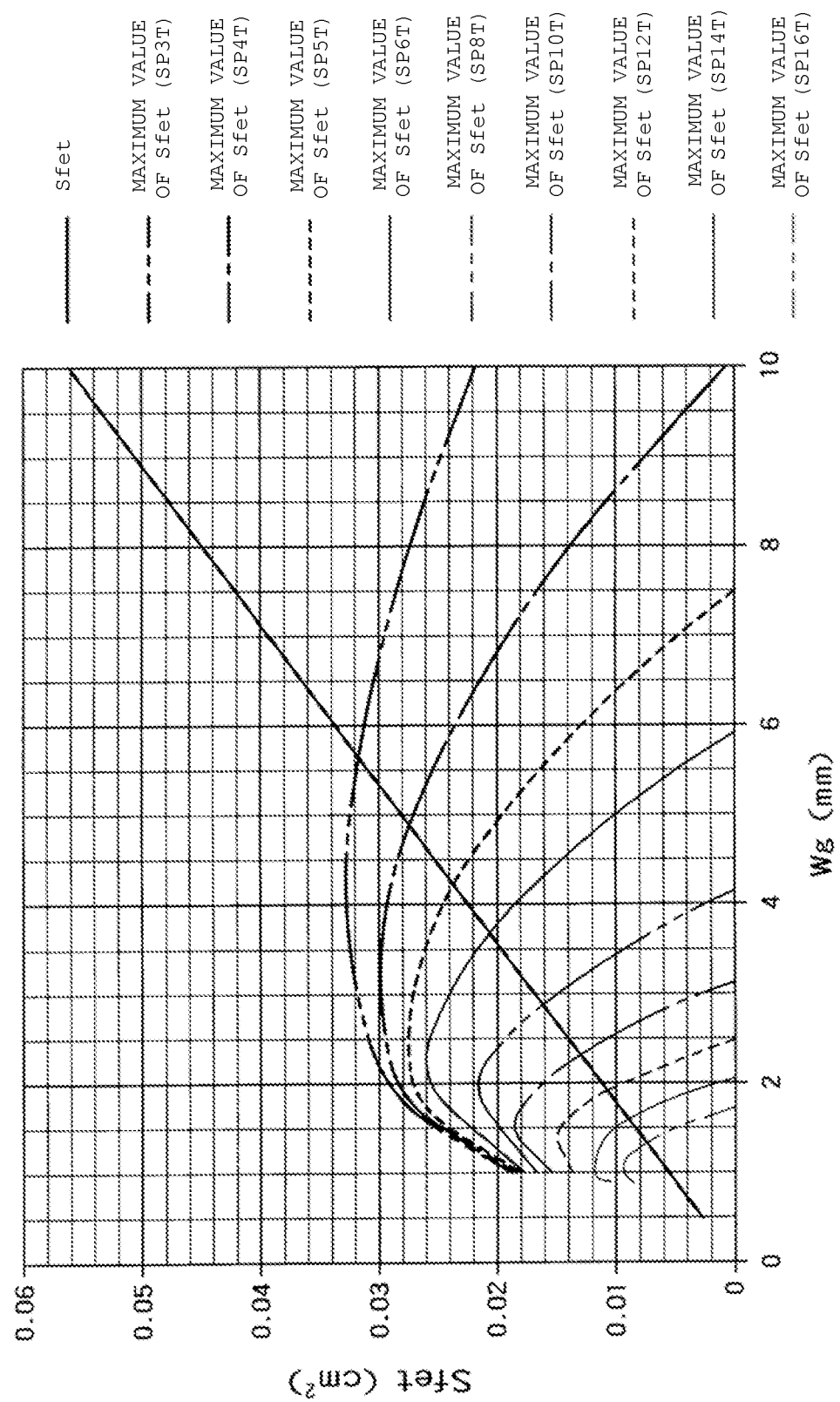
FIG. 14 is a graph illustrating a relationship between a maximum value of the area in SP3T to SP16T switches and the gate width.

FIG. 14 is a graph illustrating a relationship between a maximum value of the area Sfet in SP3T to SP16T switches and the gate width Wg. As illustrated, as the number (that is, n) of high frequency terminals is increased, the number of through FET groups (that is, MOSFET) which is in a non-conductive state is increased. Thus, the sum Ctotal of the off-capacitance Coff is increased, and a maximum value of the area Sfet is decreased. Therefore, in a multi-port semiconductor switch, the gate width Wg may be reduced with an increase in the number of high-frequency terminals so as to set the insertion loss at 3.5 GHz to be 1 dB or less.

For example, from the results illustrated in FIG. 14, the gate width Wg may be set to be 5.6 mm or less in the SP3T switch, the gate width Wg may be set to be 4.8 mm or less in the SP0T switch, the gate width Wg may be set to be 4.2 mm or less in the SP5T switch. The gate width Wg may be set to be 3.6 mm or less in the SP6T switch, the gate width Wg may be set to be 3.2 mm or less in the SP1T switch, and the gate width Wg may be set to be 2.8 mm or less in the SP8T switch. The gate width Wg may be set to be 2.5 mm or less in the SP9T switch, the gate width Wg may be set to be 2.3 mm or less in the SP10T switch, and the gate width Wg may be set to be 1.9 mm or less in the SP12T switch. The gate width Wg may be set to be 1.6 mm or less in the SP14T switch, and the gate width Wg may be set to be 1.3 mm or less in the SP16T switch.

From these results, it is known that the gate width Wg may be set to be 1.9 mm or less in the SP11T switch, the gate width Wg may be set to be 1.6 mm or less in the SP13T switch, and the gate width Wg may be set to be 1.3 mm or less in the SP15T switch. Furthermore, even if the number of high frequency terminals is increased, a maximum value of the gate width Wg may be calculated in the same manner.

As described above, according to the disclosure, an area of the through FET group 101 is less than or equal to the area Sfet, which is calculated by using an equivalent circuit including the resistance Rs that represents leakage of a high frequency signal from the through FET group 101 to a supporting substrate. Accordingly, it is possible to reduce the leakage of a high frequency signal from the through FET group 101 to the supporting substrate. Therefore, insertion loss in a high frequency region may be reduced.

When an SOI substrate different from in examples described above is used or when desired insertion loss is not 1 dB, each coefficient of Expression 1 may be changed. That is, a, b, c, d, e, and f are set to be constant number, and the area Sfet may satisfy Sfet≤(a−b×Ron−c×Ctotal$^2$−d/ρs)/(e+ f/ρs). Accordingly, the same effects as above may be obtained.

Second Embodiment

A second embodiment relates to a wireless apparatus 70 that includes the semiconductor switch 10 of the first embodiment.

Figure 15:
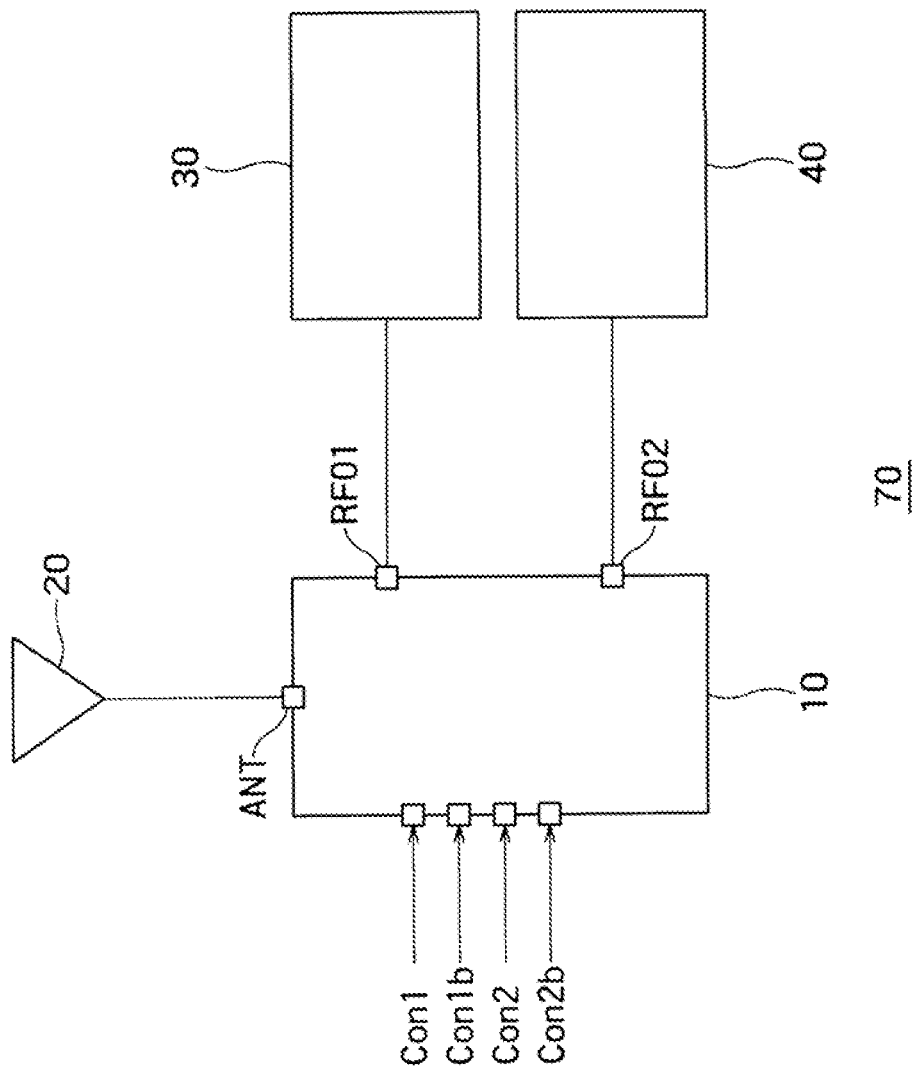
FIG. 15 is a block diagram illustrating a schematic configuration of a wireless apparatus according to a second embodiment.

FIG. 15 is a block diagram illustrating a schematic configuration of the wireless apparatus 70 according to the second embodiment. As illustrated in FIG. 15, the wireless apparatus 70 includes the semiconductor 10 according to the first embodiment, an antenna 20, a transmitting circuit 30, and a receiving circuit 40.

The antenna 20 transmits and receives a radio signal at a frequency of 3.5 GHz or more, for example. The antenna 20 is connected to the antenna terminal ANT of the semiconductor switch 10. The transmitting circuit 30 is connected to the high frequency terminal RF01 of the semiconductor switch 10 to transmit a radio signal. The receiving circuit 40 is connected to the high frequency terminal RF02 of the semiconductor switch 10 to receive a radio signal.

During transmission, the high frequency terminal RF01 and the antenna terminal ANT are electrically connected (a conductive state between these elements), the high frequency terminal RF02 and the antenna terminal ANT are electrically disconnected (a non-conductive state between these elements), and the transmitting circuit 30 transmits a radio signal through the semiconductor switch 10 and the antenna 20. During reception, the high frequency terminal RF01 and the antenna terminal ANT are electrically disconnected (a non-conductive state between these elements), the high frequency terminal RF02 and the antenna terminal ANT are electrically connected (a conductive state between these elements), and the receiving circuit 40 receives a radio signal through the antenna 20 and the semiconductor switch 10.

As described above, since the semiconductor switch 10 according to the first embodiment has small insertion loss in a high frequency region exceeding 3.5 GHz, it is possible to reduce output power of power amplifier (not specially illustrated) required in the transmitting circuit 30 during transmission. As a result, power consumption of the wireless apparatus 70 may be reduced. An SN (signal-to-noise) ratio, which is a ratio of a signal level to a noise level of a radio signal input to a Radio Frequency Integrated Circuit (RFIC, not specifically illustrated) or a Low Noise Amplifier (LNA, not specifically illustrated) in the receiving circuit 40 is increased during reception, whereby reception sensitivity may be improved.

FIG. 15 illustrates an example in which the SPDT switch is used as the semiconductor switch 10; however, a SPnT switch may be used to switch more connections to the antenna 20 of the transmitting circuit and the receiving circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor switch on an SOI substrate that includes a supporting substrate, an insulating layer on the supporting substrate, and a semiconductor layer provided on the insulating layer, the semiconductor switch comprising:
a first through FET group and a second through FET group, each including a plurality of field effect transistors connected in series between a common node and, respectively, a first or a second node, wherein
an area of the first through FET group is equal to or less than an area Sfet, wherein
the area Sfet is a function of an on-state resistance Ron of the first through FET group in a conductive state, a sum Ctotal of off-capacitances of any through FET groups in the semiconductor switch in a non-conductive state, and resistivity ρs of the supporting substrate, and the area Sfet satisfies:

area Sfet≤(*a*−*b*×Ron−*c*×Ctotal$^2$−*d*/ρs)/(*e*+*f*/ρs), where a unit of the resistivity ρs is in Ωcm, a unit of the on-state resistance Ron is in Ω, a unit of the sum Ctotal of the off-capacitances is in pF, a unit of the area Sfet in cm$^2$, and a, b, c, d, e, and f are constants.

2. The semiconductor switch according to claim 1, wherein the area Sfet satisfies:

area Sfet≤(1.08−0.11×Ron−1.1×Ctotal$^2$−160/ρs)/(2+ 4.5×10$^4$/ρs).

3. The semiconductor switch according to claim 1, wherein the area Sfet is less than or equal to 0.027 cm$^2$.

4. The semiconductor switch according to claim 1, wherein a gate width of each field effect transistor in the first through FET group is less than or equal to 6.3 mm.

5. The semiconductor switch according to claim 4, wherein the gate width of each field effect transistor in the first through FET group is equal to or greater than 0.4 mm.

6. The semiconductor switch according to claim 1, wherein the first through FET and the second through FET have equal areas.

7. The semiconductor switch according to claim 1, wherein the semiconductor switch is a single pole double throw (SPDT) switch.

8. The semiconductor switch according to claim 1, wherein the semiconductor switch is a single pole n-throw (SPnT) switch that includes n total through FET groups each including a plurality of field effect transistors connected in series between the common node and, respectively, an n$^{th}$ node, where n is 3 or more.

9. A wireless apparatus, comprising:
an antenna for transmitting or receiving a radio signal;
a semiconductor switch on an SOI substrate that includes a supporting substrate, an insulating layer on the supporting substrate, and a semiconductor layer provided on the insulating layer, the semiconductor switch comprising:
a first through FET group and a second through FET group, each including a plurality of field effect transistors connected in series between a common node connected to the antenna and, respectively, a first node or a second node, wherein an area of the first through FET group is equal to or less than an area Sfet, and the common node is connected to the antenna, wherein the area Sfet is a function of an on-state resistance Ron of the first through FET group in a conductive state, a sum Ctotal of off-capacitances of any through FET groups in the semiconductor switch in a non-conductive state, and a resistivity ρs of the supporting substrate, and the area Sfet satisfies:

area Sfet≤(a−b×Ron−c×Ctotal²−d/ρs)/(e+f/ρs), where a unit of the resistivity ρs is in Ωcm, a unit of the on-state resistance Ron is in Ω, a unit of the sum Ctotal of the off-capacitances is in pF, a unit of the area Sfet in cm², and a, b, c, d, e, and f are constants;

a transmitting circuit that is connected to the first node of the semiconductor switch and is configured to transmit the radio signal; and a receiving circuit that is connected to the second node of the semiconductor switch and is configured to receive the radio signal.

10. The wireless apparatus according to claim 9, wherein the semiconductor switch is a single pole double throw (SPDT) switch.

11. The wireless apparatus according to claim 9, wherein the semiconductor switch is a single pole n-throw (SPnT) switch that includes n total through FET groups each including a plurality of field effect transistors connected in series between the common node and, respectively, an $n^{th}$ node, where n is 3 or more.

12. The wireless apparatus according to claim 11, wherein a gate width of each field effect transistor in the through FET groups is:

3.6 mm or less when n is one of 3, 4, 5, and 6,
2.8 mm or less when n is one of 7 and 8,
2.3 mm or less when n is one of 9 and 10,
1.9 mm or less when n is one of 11 and 12, and
1.3 mm or less when n is one of 13, 14, 15, and 16.

13. The wireless apparatus according to claim 9, wherein a gate width of each field effect transistor in the first through FET group is in a range from 6.3 mm to 0.4 mm, inclusive.

14. The semiconductor switch according to claim 9, further including:

a first shunt transistor group connected to ground potential and a node that is between the first node and the first through FET group; and a second shunt transistor group connected ground potential and a node between the second node and the second through FET group.

15. A semiconductor switch on an SOI substrate that includes a supporting substrate, an insulating layer on the supporting substrate, and a semiconductor layer on the insulating layer, the semiconductor switch comprising:

a first through FET group and a second through FET group, each comprising a plurality of field effect transistors connected in series between a common node and, respectively, a first or a second node;

a first shunt transistor group connected to ground potential and a node that is between the first node and the first through FET group; and a second shunt transistor group connected to ground potential and a node that is between the second node and the second through FET group, wherein an area of the first through FET group is equal to or less than an area Sfet that is calculated using an equivalent circuit including a resistance Rs that represents resistance to leakage of a high frequency signal from the first through FET group to the supporting substrate.

16. The semiconductor switch according to claim 15, wherein the area Sfet is 0.027 cm² or less.

* * * * *